(12) United States Patent
Park et al.

(10) Patent No.: US 6,387,759 B1
(45) Date of Patent: May 14, 2002

(54) METHOD OF FABRICATING A SEMICONDUCTOR DEVICE

(75) Inventors: Jeong-Soo Park; Wouns Yang; Hyun-Jo Yang, all of Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/299,577

(22) Filed: Apr. 27, 1999

(30) Foreign Application Priority Data

May 18, 1998 (KR) ............................................. 98-17781
Sep. 3, 1998 (KR) ............................................. 98-36340

(51) Int. Cl.⁷ ...................... H01L 21/8234; H01L 21/44
(52) U.S. Cl. ...................... 438/275; 438/586; 438/587; 438/672; 438/691
(58) Field of Search ........................ 438/41, 187, 228, 438/149, 157, 195, 197, 241, 275, 585, 586, 637, 645, 670, 587, 672, 691; 257/288, 365, 389, 412

(56) References Cited

U.S. PATENT DOCUMENTS

| | | | | |
|---|---|---|---|---|
| 5,541,870 A | * | 7/1996 | Mihara et al. | 365/145 |
| 5,561,307 A | * | 10/1996 | Mihara et al. | 257/295 |
| 5,741,719 A | * | 4/1998 | Kim | 437/43 |
| 5,796,143 A | * | 8/1998 | Fulford et al. | 257/330 |
| 5,821,143 A | * | 10/1998 | Kim | 438/267 |
| 5,940,710 A | * | 8/1999 | Chung et al. | 438/305 |
| 5,946,548 A | * | 8/1999 | Hashimoto | 438/41 |
| 5,956,594 A | * | 9/1999 | Yang et al. | 438/396 |
| 6,020,236 A | * | 2/2000 | Lee et al. | 438/253 |
| 6,211,026 B1 | * | 4/2001 | Ahmad et al. | 438/300 |
| 6,251,731 B1 | * | 6/2001 | Wu | 438/275 |
| 6,300,178 B1 | * | 10/2001 | Sunouchi | 438/199 |

* cited by examiner

Primary Examiner—Mary Wilczewski
(74) Attorney, Agent, or Firm—Fleshner & Kim, LLP (57) ABSTRACT

A method of fabricating semiconductor device is provided that includes a method of forming plugs in a semiconductor device. The plugs or contacts can connect an upper conductive layer to a lower conductive layer. The plugs are preferably formed without providing contact holes. The method of fabricating a semiconductor device can include the steps of defining an active area of a device by forming a field insulating layer on a semiconductor substrate of a first conductivity type, forming a gate oxide on an exposed surface of the active layer and forming a plurality of gates and associated cap insulating layers along a first direction perpendicular to an active area. An impurity region of a second conductivity type is formed in the exposed active area of the semiconductor substrate and a plurality of sidewall spacers are formed at sides of the gates. An electrically-conductive layer is formed for contacting the impurity region between the gates on the semiconductor substrate. The method can further include forming a plurality of plugs by patterning the electrically-conductive layer so that the plugs contact the impurity region, and an insulating interlayer is then formed where the plugs are not formed between the gates.

22 Claims, 11 Drawing Sheets

METHOD OF FABRICATING A SEMICONDUCTOR DEVICE

BACKGROUND OF THE INVENTION

1. Field of the Invention

The present invention relates to a method of fabricating semiconductor device, and in particular, to a method of forming contacts or plugs in semiconductor device.

2. Background of the Related Art

Width of a wire and an unit cell area on a chip decrease as semiconductor device integration increases. Alignment tolerance between a gate and a contact hole, for example, that exposes an impurity region for a source/drain junction of a cell is important because it has a direct influence on an yield and allows little alignment error.

Self-Aligned Contact (SAC) is a related art technique to prevent misalignment between a gate and a contact hole due to the reduced cell area. SAC can form a contact hole exposing an impurity region without exposing a gate, despite misalignment. SAC forms a sidewall spacer and a capping insulating layer on the side and upper surfaces of the gate using an insulating substance having an etch selectivity different from an insulating interlayer. In SAC, the gate is not exposed in spite of misalignment because the etch selectivity between the insulating interlayer and the capping insulating layer or the sidewall spacer is high.

Figure 1:
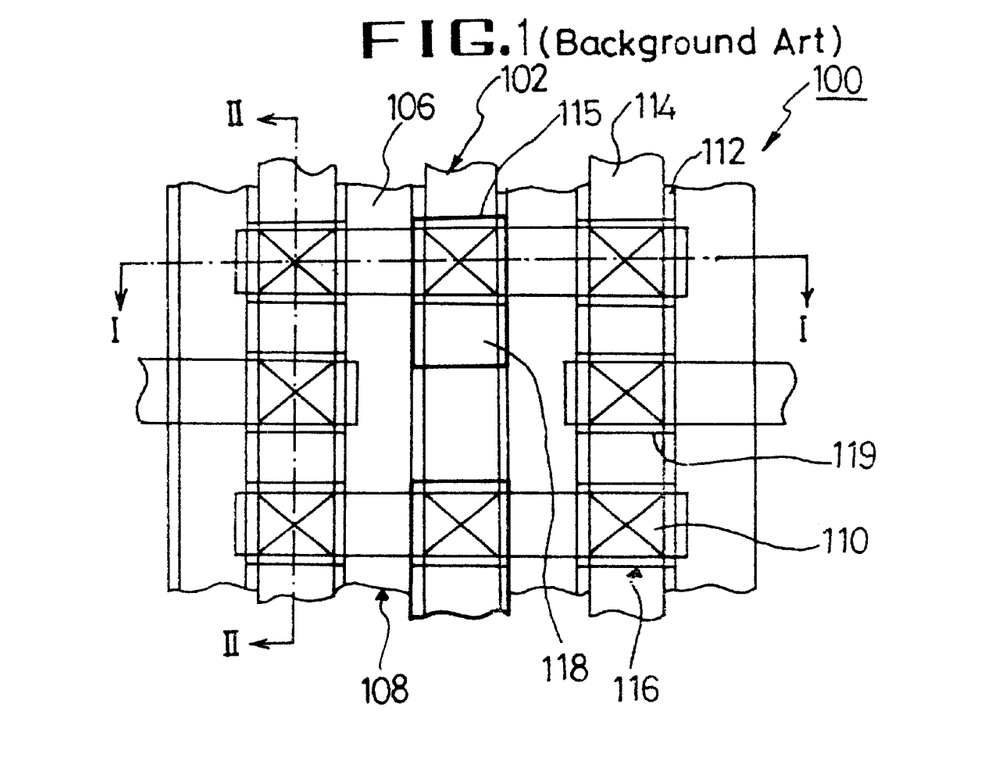
FIG. 1 is a diagram that shows a layout of a related art semiconductor device.

FIG. 1 is a diagram that shows a layout of a related, art semiconductor device. Referring to FIG. 1, a field insulating layer 102 is formed on a semiconductor substrate 100 to define an active area of a device. A plurality of word lines (gate lines) overlap the active area and the field insulating layer 102 and are formed in a direction perpendicular to the active area on the semiconductor substrate 100. In this case, a first cap insulating layer 108 and a sidewall spacer 112 are formed on an upper surface and at the side of the gate 106, respectively.

An impurity region 110 doped with impurity ions having a type opposite to the substrate 100 is formed in the active area around both sides of the gate 106 to be a source/drain region. A first insulating interlayer 114 having an etch selectivity different from that of the first cap insulating layer 108 and the sidewall spacer 112 is formed to cover the above structure on the semiconductor substrate 100. First contact holes 115 and 116 exposing the impurity region 110 are formed in the first insulating interlayer 114. The first contact holes 115 and 116 are formed in a self-aligned manner because of the etch selectivity between the first insulating interlayer 114 and the first cap insulating layer 108 or the sidewall spacer 112. The first contact hole 115 exposes a portion of the field insulating layer 102 as well as the impurity region 110. However, the other first contact hole 116 exposes only the impurity region 110. First plugs 118 and 119 are formed in the first contact holes 115 and 116 to contact the impurity region 110.

Figure 2A:
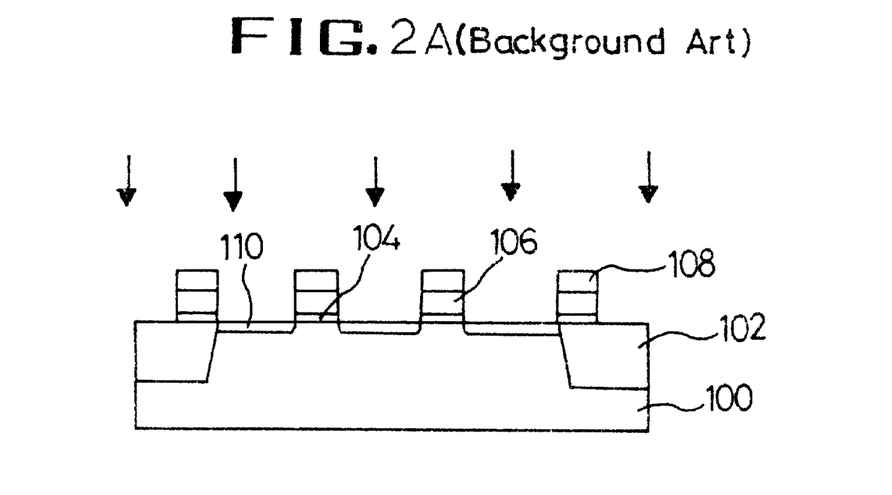
FIGS. 2A–2C is are diagrams that show cross-sectional views along a cutting line I—I in FIG. 1 of a related art method of fabricating a semiconductor device.
Figure 2B:
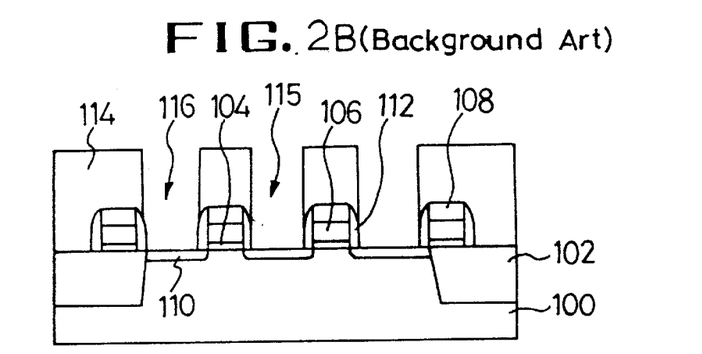
Figure 2C:
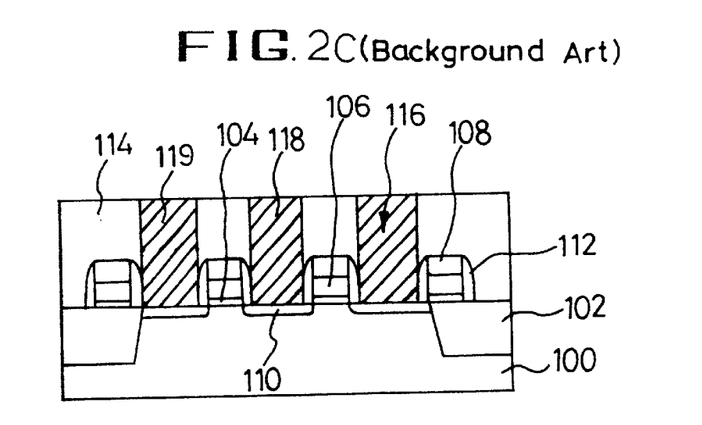
Figure 3:
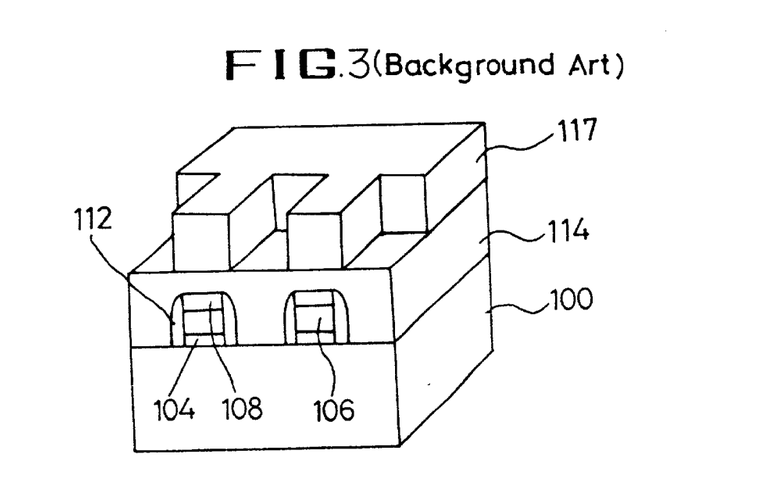
FIG. 3 is a diagram that shows a perspective view of a related art SAC process.

FIG. 2A to FIG. 2C are diagrams that show cross-sectional views of fabricating a related art semiconductor device in accordance with a cutting line I—I in FIG. 1. FIG. 3 is a diagram that shows a three-dimensional view of a related art SAC process step. Referring to FIG. 2A, an active area is defined by forming a field insulating layer 102 in a P-typed semiconductor substrate 100 with a shallow trench isolation method (STI).

A gate oxide 104 is formed by thermally oxidizing an exposed portion of the semiconductor substrate 100. Silicon nitride and impurity-doped polycrystalline silicon are formed on the field insulating layer 102 and the gate oxide layer 104 by chemical vapor deposition (CVD).

The silicon nitride and polycrystalline silicon are patterned by photolithography. The polycrystalline silicon becomes a gate 106 and the silicon nitride becomes a first cap insulating layer 108. An impurity region 110 for a source/drain region is formed by implanting N-type impurities in the exposed portion of the active area on the semiconductor substrate 100 using the first cap insulating layer 108 as a mask.

Referring to FIG. 2B, a sidewall spacer 112 is formed at the sides of the gate 106 and the first cap insulating layer 108. The sidewall spacer 112 is formed by depositing an insulating substance having the same etch rate as the first cap insulating layer 108. Accordingly, silicon nitride or the like is deposited on a whole surface of the above structure and then, the insulating substance is etched with reactive ion etch (RIE) or the like to expose the impurity region 110.

A first insulating interlayer 114 is formed by either depositing silicon oxide such as Undoped Silicate Glass (USG), Phosphor Silicate Glass (PSG), Borophospho Silicate Glass (BPSG), Tetra Ethyl Ortho Silicate (FEOS) or the like or coating the semiconductor substrate 100 with Spin On Glass (SOG) to cover the first cap insulating layer 108 and the sidewall spacer 112. First contact holes 115 and 116, which expose the impurity region 110, are formed by patterning the first insulating layer 114 with photolithography. In this case, the contact holes may be formed by SAC as an etch rate of the first cap insulating layer 108 or the sidewall spacer 112 is different from that of the first insulating interlayer 114.

The first contact holes 115 and 116 are formed by coating the first insulating interlayer 114 with a photoresist 117, by patterning the photoresist 117 as shown in Pig. 3, and etching the first insulating interlayer 114 using the photoresist 117 as a mask. The first contact hole 115 is formed to expose both portions of the field insulating layer 102 and the impurity region 110, while the other first contact hole 116 is formed to expose only the impurity region 110.

Referring to FIG. 2C, polycrystalline silicon doped with impurities is deposited on the first insulating interlayer 114 by CVD to fill up the first contact holes 115 and 116. First plugs 118 and 119 are formed by etching back the polycrystalline silicon with a chemical-mechanical polishing (CMP) method to expose the first insulating interlayer 114. Thus, the first plugs 118 and 119 are only within the contact holes 115 and 116.

The first plug 118 contacts the impurity region 110 in the first contact hole 115 and also extends to the field insulating layer 102, while the other first plug 119 contacts the impurity region in the second contact hole 116. The extended part of the first plug 118, not shown in the drawing, contacts a bitline perpendicular to the gate 106 over the field region.

FIG. 4A to FIG. 4D are diagrams that show cross-sectional views of a related art method of fabricating a semiconductor device that carries out a process in a cell region CA1 and a peripheral region PA1 simultaneously. Reference numbers of identical elements in FIG. 2A to FIG. 2C are the same.

Figure 4A:
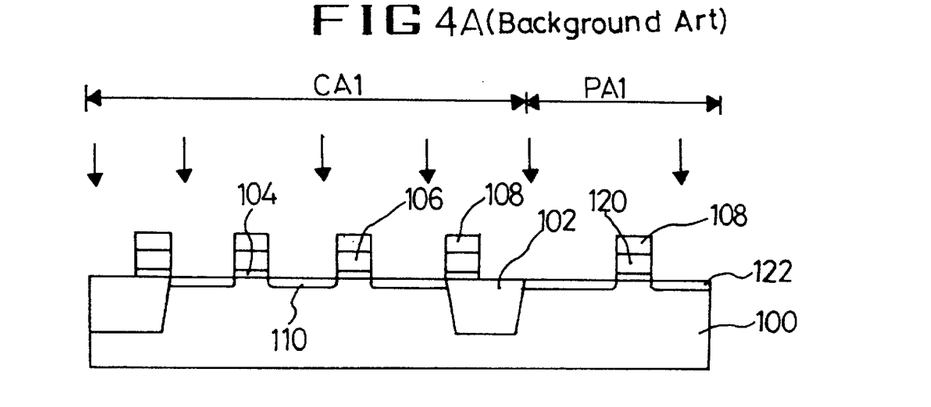
FIGS. 4A–4D are diagrams that show cross-sectional views of another related art method of fabricating a semiconductor device in a cell region and a peripheral region simultaneously.
Figure 4B:
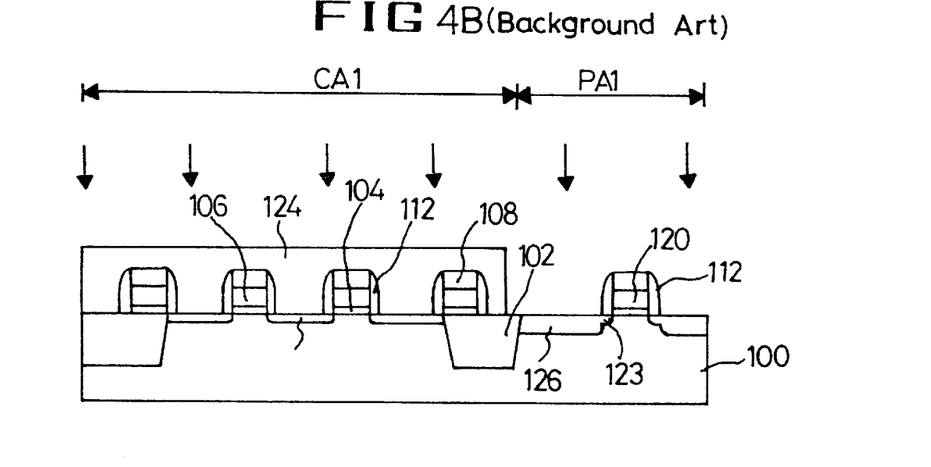

Referring to FIG. 4A, an active area of a device is defined by forming a field insulating layer 102 with an STI method in a P-type semiconductor substrate 100 having a cell region CA1 and a peripheral region PA1. A gate oxide 104 is formed by thermally oxidizing an exposed portion of the semiconductor substrate 100. Silicon nitride and polycrystalline silicon, which is doped with impurities, are formed on the field insulating layer 102 and the gate oxide layer 104 by CVD. The silicon nitride and polycrystalline silicon are patterned by photolithography. The polycrystalline silicon becomes gates 106 and 120 and the silicon nitride becomes a first cap insulating layer 108. An impurity region 110 for a source/drain region of a memory cell and a lightly-doped impurity region 122 for an lightly doped drain (LDD) of a driving cell are formed in the cell region CA1 and the peripheral region PA1, respectively, by implanting N-typed impurities lightly in the exposed portions of the active area on the semiconductor substrate 100 using the first cap insulating layer 108 as a mask. Referring to FIG. 4B, a sidewall spacer 112 is formed at the sides of the gate 106 and the first cap insulating layer 108. The sidewall spacer 112 is formed by depositing an insulating substance, which has the same etch rate as the first cap insulating layer 108, such as silicon nitride on a whole surface of the above structure. By etching back the insulating substance with a reactive ion etch (RIE) or the like, the impurity regions 110 and 122 are exposed.

The peripheral region PA1 is exposed by exposure and development after the semiconductor substrate 100 has been coated with photoresist 124. A heavily-doped impurity region 126 is formed by implanting N-typed impurities in an exposed portion of the peripheral region PA1 on the semiconductor substrate 100 using the photoresist 124 as a mask. The heavily-doped impurity region 126 overlaps the lightly-doped impurity region 122 and is used for a source/drain region of the driving cell.

Figure 4C:
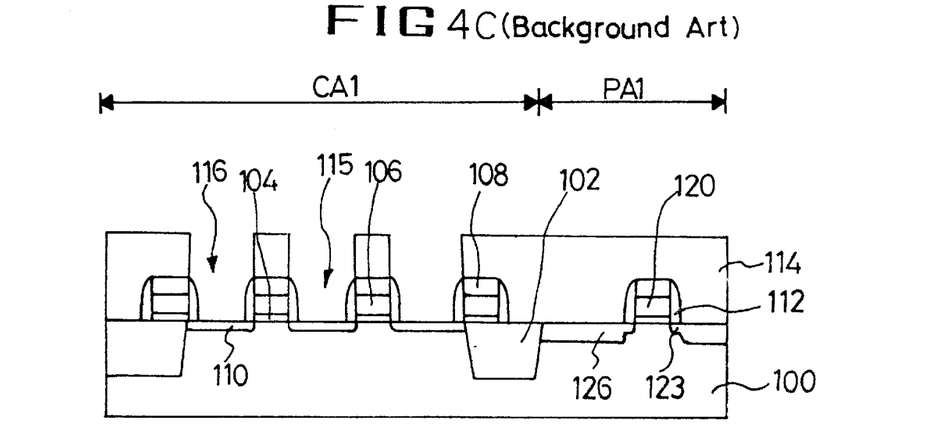

A first insulating interlayer 114 is formed by either depositing silicon oxide such as USG, PSG, BPSG, TEOS or the like on the semiconductor substrate 100 or coating the semiconductor substrate 100 with SOG to cover the first cap insulating layer 108 and the sidewall spacer 112. The first contact holes 115 and 116 exposing the impurity region 110 in the cell region CA1 are formed by patterning the first insulating interlayer 114 with photolithography. The first contact hole 115 is formed to expose the field insulating layer 102 and the impurity region 110, while the other first contact hole 116 is formed to expose the impurity region 110. The first contact holes 115 and 116 may be formed by SAC as an etch rate of the first cap insulating layer 108 or the sidewall spacer 112 is different from that of the first insulating interlayer 114.

Figure 4D:
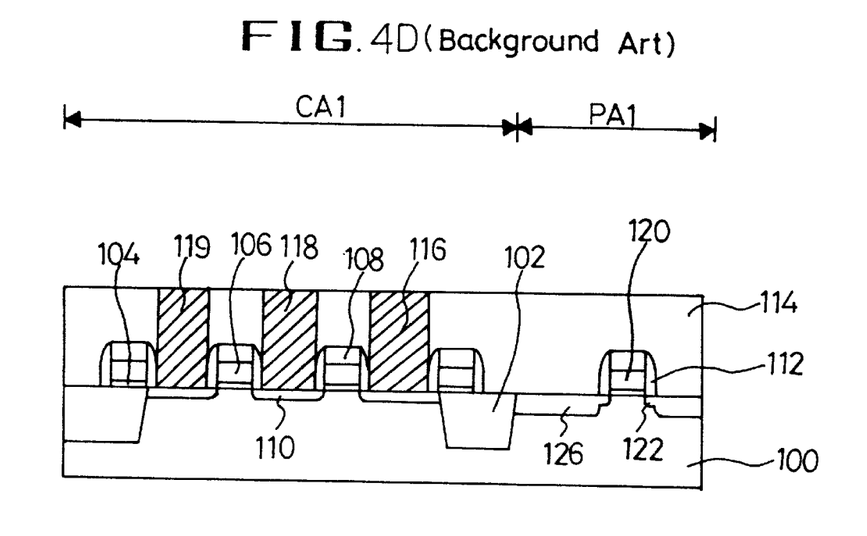

Referring to FIG. 4D, polycrystalline silicon doped with impurities is deposited on the first insulating interlayer 114 by CVD to fill the first contact holes 115 and 116. The first plugs 118 and 119 remain only inside the first contact holes 115 and 116. The first plugs 118 and 119 are formed by etching back the polycrystalline silicon by CMP to expose the first insulating interlayer 114. Accordingly, the first plug 118 contacts the impurity region 110 in the first contact hole 115 and extends to the field insulating layer 102, while the other first plug 119 contacts the second contact hole 116. The extended part of the first plug 118 over the field insulating layer 102 (not shown) contacts a bitline, which is perpendicular to the gate 106 over the field region.

FIG. 5A to FIG. 5D are diagrams that show cross-sectional views of another related art fabricating method for a semiconductor device, which begins after the step shown in FIG. 2C, and includes forming a second plug. The cross-sectional views in FIGS. 5A–5D correspond to cutting lines I—I and II—II in FIG. 1.

Figure 5A:
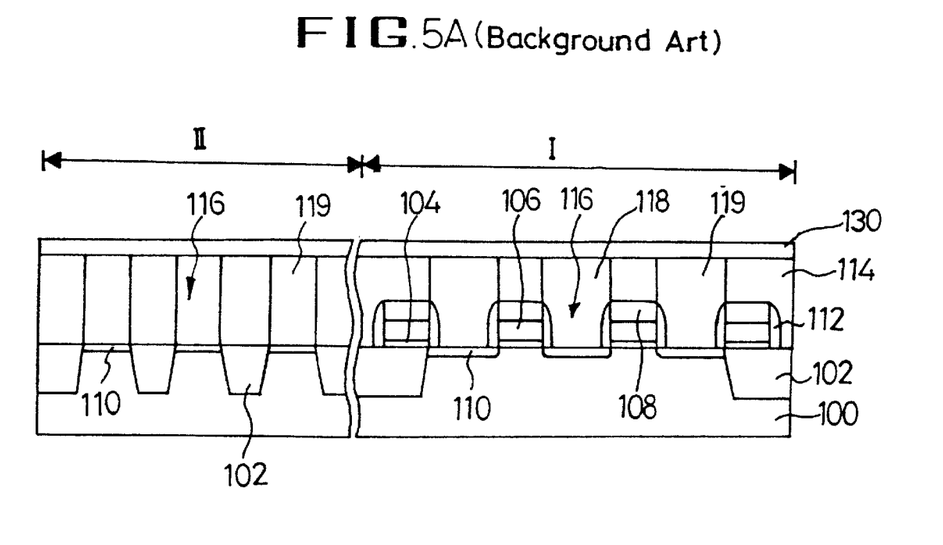
FIGS. 5A–5D are diagrams that show cross-sectional views along cutting lines I—I and II—II in FIG. 1 of a related art method of fabricating a semiconductor device that forms a second plug.
Figure 5B:
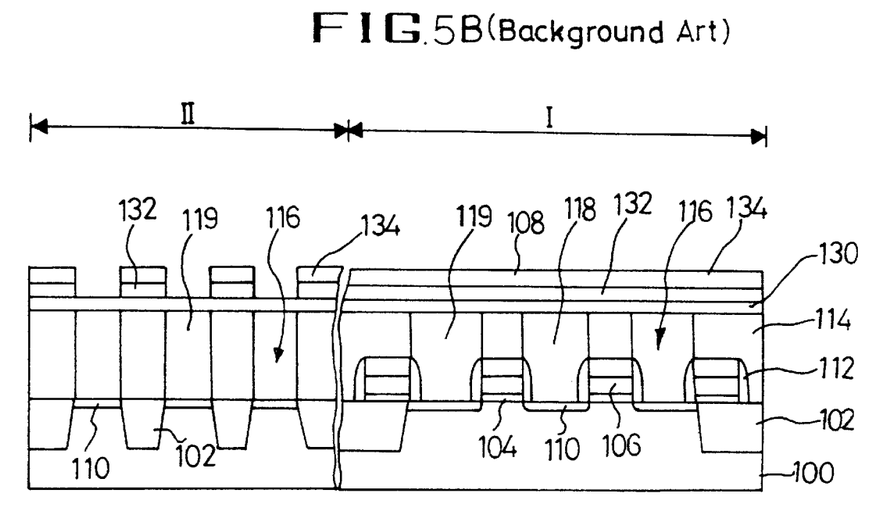

After the completion of the step in FIG. 2C, a second insulating interlayer 130 is formed by depositing silicon oxide by CVD on both of the first insulating interlayer 114 and the first plugs 118 and 119 as shown in FIG. 5A. Referring to FIG. 5B, the extended part of the first plug 118 to the field insulating layer 102 is exposed by patterning the second insulating interlayer 130 with photolithography. An electrically-conductive substance such as W etc. is deposited on the second insulating interlayer 130 to contact an exposed portion of the first plug 118. Then, an insulating substance having a different etch rate than the second insulating interlayer 130 such as silicon nitride or the like is deposited on the electrically-conductive substance of metal.

A second cap insulating layer 134 and a bitline 132 are successively formed by patterning the insulating substance and the electrically-conductive substance with photolithography. Thus, the bitline 132 and the second cap insulating layer 134 are formed along a direction perpendicular to the gate 106 over the field insulating layer 102.

Figure 5C:
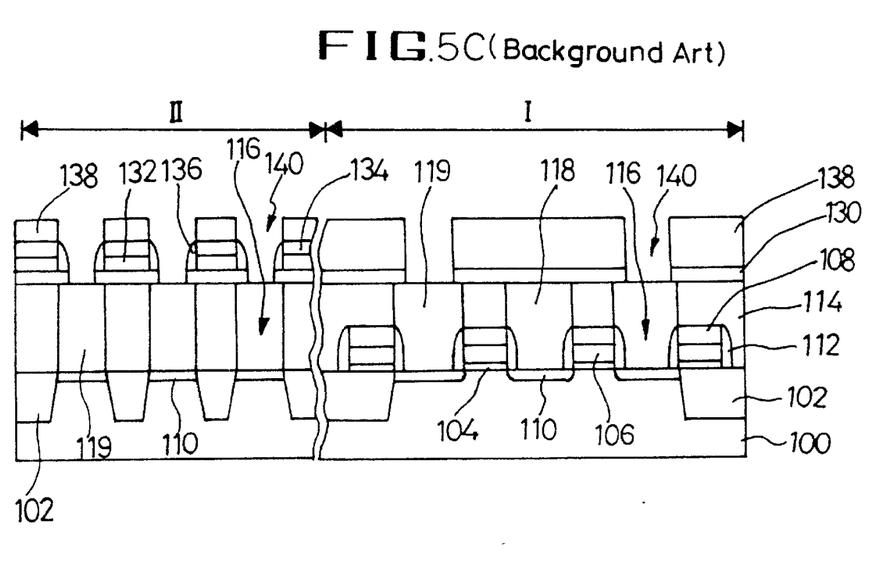

Referring to FIG. 5C, a sidewall spacer 136 is formed at sides of the bitline 132 and the second cap insulating layer 134. The sidewall spacer 136 is formed by depositing an insulating substance such as silicon nitride etc. on the second insulating interlayer 130 to cover the second cap insulating layer 134 and etching back the insulating substance with RIE. A third insulating interlayer 138 is formed on the second insulating interlayer 130 to cover both the second cap insulating layer 134 and the sidewall spacer 136. A second contact hole 140 exposing the first plug 119 is formed by patterning the second and third insulating interlayers 130 and 138 with photolithography. The second contact hole may be formed by SAC because etch rates of the cap insulating layer 134 and the sidewall spacer 136 differ from those of the second and third insulating interlayers 130 and 138.

Figure 5D:
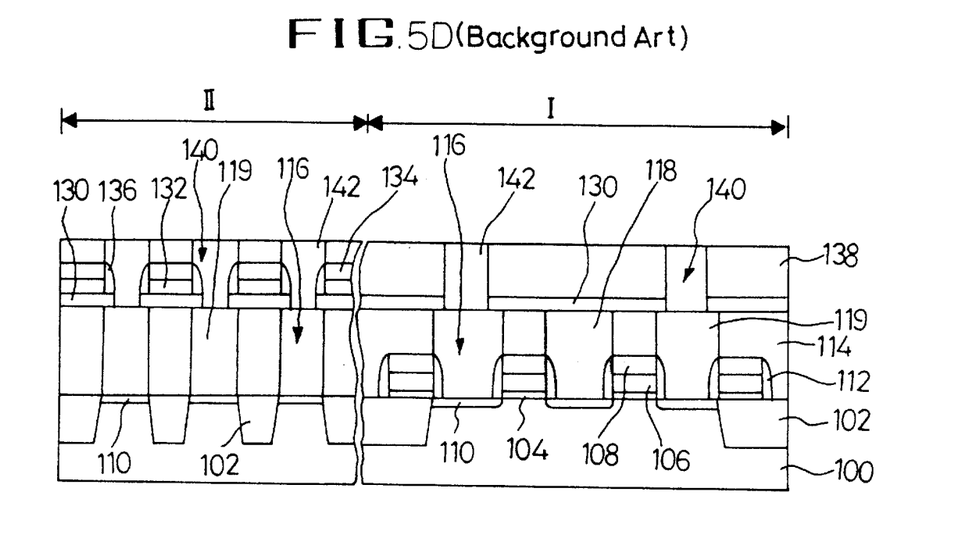

Referring to FIG. 5D, polycrystalline silicon doped with impurities is deposited on the third insulating interlayer 138 by CVD to fill the second contact holes 140. A second plug 142 is left only within the second contact hole 140 by etching back the polycrystalline silicon using CMP to expose the third insulating interlayer 138.

As described above, the related art methods of fabricating semiconductor devices have various disadvantages. The related art methods of forming semiconductor devices have a defect in that voids in the first plugs are formed because of a high aspect ratio of the first contact hole. Further, a thickness of the first insulating interlayer causes a problem in forming the first contact hole because the first insulating interlayer should be formed to cover the first cap insulating layer. In addition, it is difficult to expose small areas for forming the first and second contact holes of the first and second plugs in an exposure step, and the semiconductor substrate is damaged by the etch for the first contact hole. Moreover, the lightly-doped region is formed narrowly in the peripheral region. Since the sidewall spacers of the second gate in the peripheral region and the first gate in the cell region are formed in the same way, hot carriers can be generated for both from short channel effect.

The above references are incorporated by reference herein where appropriate for appropriate teachings of additional or alternative details, features and/or technical background.

SUMMARY OF THE INVENTION

An object of the present invention is to provide a method of fabricating semiconductor device that substantially obviates one or more of the problems caused by limitations and disadvantages of the related art.

Another object of the present invention is to provide a method of fabricating semiconductor device in which an exposure step is less complicated and more rapidly performed because plugs are formed without contact holes.

Another object of the present invention is to provide a method of fabricating semiconductor device that prevents etch damage on a semiconductor substrate during plug DOS formation.

Another object of the present invention is to provide a method of fabricating semiconductor device that prevents the generation of hot carriers caused by the short channel effect.

Another object of the present invention is to provide a method of fabricating semiconductor device that prevents the generation of hot carriers caused by the short channel effect of a driving cell in a peripheral region.

To achieve at these and other advantages in a whole or in parts and in accordance with the purpose of the present invention, as embodied and broadly described, a method of fabricating a semiconductor device according to the present invention includes the steps of defining an active area of device by forming a field insulating layer on a semiconductor substrate of a first conductive type, forming a gate oxide on an exposed surface of the active layer in the semiconductor substrate and forming a plurality of gates and a cap insulating layer in a direction perpendicular to the active area, forming an impurity region of a second conductive type in the exposed active area of the semiconductor substrate and forming a plurality of sidewall spacers at sides of the gates, forming an electrically-conductive layer to be contacted with the impurity region between the gates on the semiconductor substrate, forming a plurality of plugs by patterning the electrically-conductive layer wherein the plugs are contacted with the impurity region, and forming an insulating interlayer on a place where the plugs are not formed between the gates.

In another aspect, to further achieve at least the above objects in a whole or in parts, a method of forming a semiconductor device according to the present invention includes forming a semiconductor substrate of a first conductivity type, forming a plurality of gates along a first direction on the semiconductor substrate, forming impurity regions of a second conductive type in the substrate along sides of the gates, forming a plurality of sidewall spacers at the sides of the gates, forming a conductive layer that contacts the impurity regions adjacent the gates and forming a plurality of plugs by patterning the conductive layer.

To further achieve the above objects, a method of manufacturing a semiconductor device according to the present invention includes forming a semiconductor substrate of a first conductivity type having an active area, wherein the semiconductor substrate includes a cell region and a peripheral region, forming a plurality of gates along a first direction in the cell and peripheral regions, forming a first impurity region along at least one gate in the cell region and a second impurity region along at least one gate in the peripheral region, forming a first etch-stop layer covering both of the semiconductor substrate and the gates in the peripheral region and forming first sidewall spacers at sides of the gates in the cell region, forming a first conductive layer between the gates to contact the first impurity region in the cell region and on the etch-stop layer in the peripheral region, forming a plurality of plugs in the cell region by patterning the first conductive layer, wherein the plugs contact the first impurity region in the cell region, forming a second sidewall spacers at the sides of the at least one gate to expose the second impurity region in the peripheral region, wherein the second sidewall spacers includes the etch-stop layer, forming a heavily-doped impurity region in an exposed part of the second impurity region in the semiconductor substrate in the peripheral region, and forming an insulating interlayer between the gates where the plugs are not formed.

To further achieve the above objects, a method of manufacturing a semiconductor device according to the present invention includes forming a semiconductor substrate of a first conductivity type, defining an active area by forming a field insulating layer on the substrate, forming a plurality of gates along a first direction on the active area, each of the gates includes a gate oxide, a gate electrode on the gate oxide and a first cap insulating layer on the gate electrode, forming impurity regions of a second conductive type in an exposed area of the substrate in the active area along sides of the gates, forming a plurality of first sidewall spacers on the sides of the gates, forming a conductive layer to contact the impurity regions between the gates, forming a plurality of first plugs by patterning the conductive layer, wherein each of the first plugs contact a corresponding impurity region, wherein extended portions of some of the first plugs extend onto the field insulating layer, forming a first insulating interlayer where the first plugs are not formed between the gates, forming a second insulating interlayer on the first cap insulating layer to cover the first plugs and patterning the second insulating interlayer to expose at least one of the extended portions of the first plugs, forming a signal lines and a second cap insulating layer on the second insulating interlayer, wherein the signal lines contact the exposed portions of the first plugs, exposing the first plugs and forming second sidewalls at sides of the signal lines by etching the second insulating interlayer, and forming second plugs that contact the exposed first plugs.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 6:
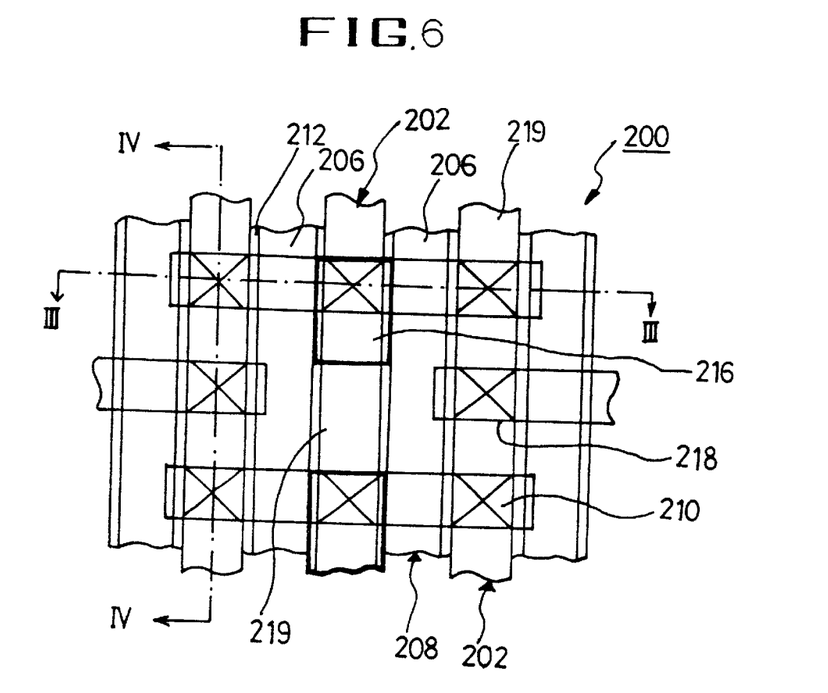
FIG. 6 is a diagram that shows a preferred embodiment of a semiconductor device according to the present invention.

FIG. 6 is a diagram that shows a layout of a first preferred embodiment of a semiconductor device according to the present invention. Referring to FIG. 6, a field w insulating layer 202 is formed on a semiconductor substrate 200 to define an active area of a device. A plurality of word lines (gate lines) that overlap the field insulating layer 202 are preferably formed perpendicular to the active area on the semiconductor substrate 200. A first cap insulating layer 208 and a sidewall spacer 212 are formed on an upper surface and at the sides of gates 206, respectively.

An impurity region 210 doped with impurity ions having a type opposite to the substrate 200 is preferably formed in the active area around both sides of the gate 206 to be a source/drain region. Plugs 216 and 218 are preferably formed on and in contact with the impurity region 210 in the semiconductor substrate 200. The plug 216 is formed only on the impurity region 210 while the plug 218 preferably lies on the field insulating layer 202 and also extends to the impurity region 210.

An insulating interlayer 219 having an etch rate different from that of the first cap insulating layer 208 and the sidewall spacer 212 is formed on an exposed portion of the field insulating layer 202. In this case, the insulating interlayer 219 is formed by etching back an insulating substance previously deposited at locations without plugs 216 and 218.

FIGS. 7A–7D are diagrams of cross-sectional views that show a first preferred embodiment of a fabrication process for a semiconductor device according to the present invention. The first preferred embodiment of a fabrication process can be used, for example, to form one preferred embodiment of a semiconductor device in accordance with a cutting line III—III shown in FIG. 6.

Figure 7A:
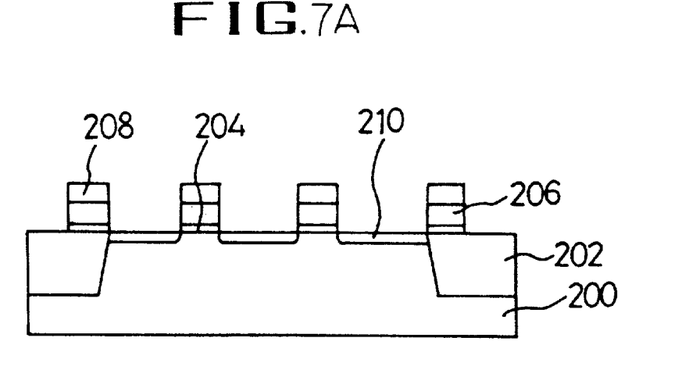
FIGS. 7A–7D are diagrams of cross-sectional views along cutting line III—III in FIG. 6 that show a preferred embodiment of a method for fabricating semiconductor device.

Referring to FIG. 7A, an active area is defined by forming a field insulating layer 202 in a P-typed semiconductor substrate 200 with a shallow trench isolation method (STD) or Local Oxidation of Silicon (LOCOS). A gate oxide 204 is formed by thermally oxidizing an exposed portion of the semiconductor substrate 200. Polycrystalline silicon doped with impurities and silicon nitride are preferably formed in order on the field insulating layer 202 and the gate oxide layer 204 by CVD. The silicon nitride and polycrystalline silicon are patterned by photolithography. In this case, the remaining polycrystalline silicon preferably becomes gates 206 and the silicon nitride on the gates 206 becomes a first cap insulating layer 208.

An impurity region 210 for a source/drain region is formed by implanting N-typed impurities such as Phosphorus (P) or Arsenic (As) in the exposed portion of the active area on the semiconductor substrate 200 using the first cap insulating layer 208 as a mask.

Figure 7B:
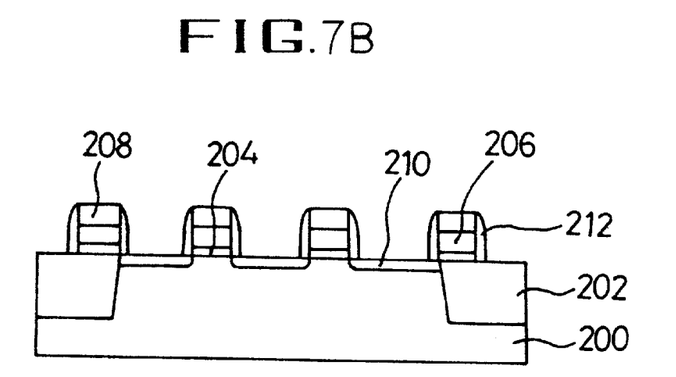

Referring to FIG. 7B, a sidewall spacer 212 is formed at the sides of the gate 206 and the first cap insulating layer 208. The sidewall spacer 212 is preferably formed by depositing insulating substance such as silicon nitride on a whole surface of the above structure and then etching back the insulating substance with RIE or the like to expose the impurity region 210.

Figure 7C:
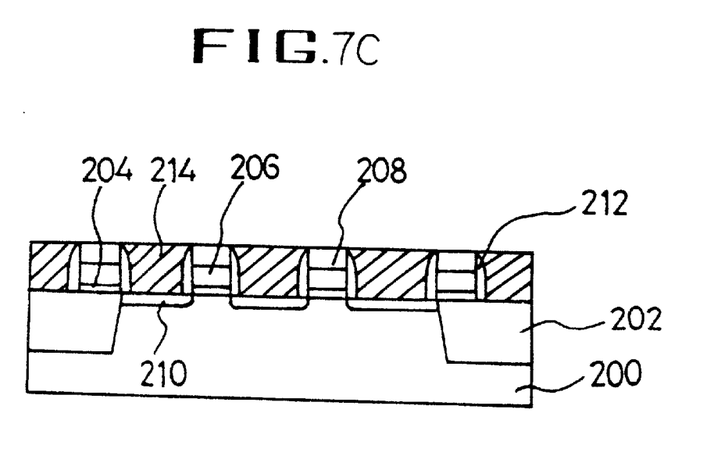

Referring to FIG. 7C, an electrically-conductive layer 214 is formed on the impurity region 210 in the semiconductor substrate 200 to cover the first cap insulating layer 208 and the sidewall spacer 212 by depositing polycrystalline silicon doped with impurities preferably using CVD. The electrically-conductive layer 214 is etched back to remain between the gates 206 using CMP until the first cap insulating layer 208 is exposed.

Figure 7D:
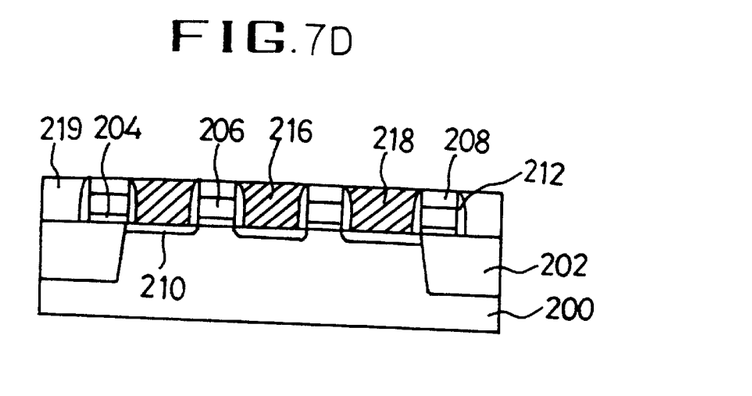
Figure 8:
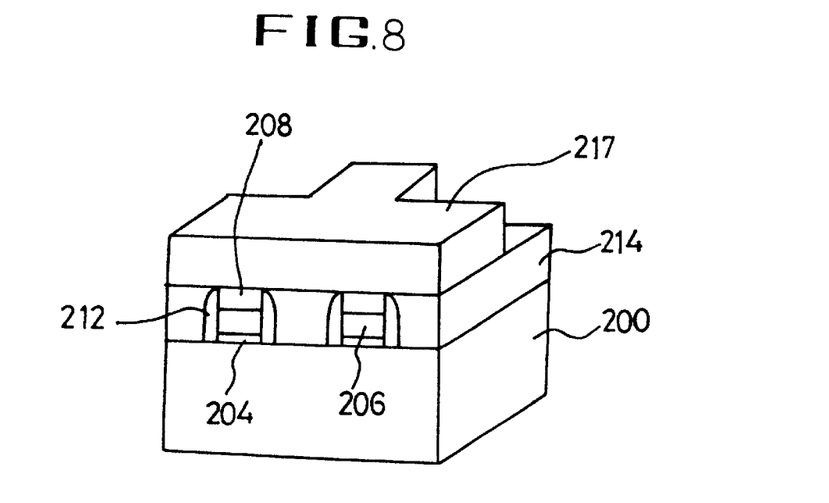
FIG. 8 is a diagram that shows a perspective view of a plug according to the preferred embodiment of FIG. 7.

Referring to FIG. 7D, first plugs 216 and 218 are preferably formed by patterning the electrically-conductive layer 214 selectively with photolithography including an anisotropic etch such as RIE or the like. In particular, the first plugs 216 and 218 are formed by etching the electrically-conductive layer 214 using a photoresist 217 as a mask to expose the field insulating layer 202 after coating and patterning the photoresist 217 as shown in FIG. 8. FIG. 8 shows a three-dimensional view of a step of forming a plug according to the present invention.

In the first preferred embodiment of a fabrication process according to the present invention, the photoresist 217 is patterned to remain on the first cap insulating layer 208 and portions of the electrically-conductive layer 214 where the first plugs 216 and 218 are to be formed so that a step of exposure is eliminated and cannot complicate a fabrication process or cause associated problems. Further, the impurity region 210 interface and connection to the first plugs 216 and 218 is free from damage caused by etching since the first plugs 216 and 218 are patterned on the impurity region 210 to expose the field insulating layer 202 or the like.

In addition, the first plug 216 is extended (not shown) to the field insulating layer 202 as well as in contact with the impurity region 210, while the other first plug 218 is only in contact with the impurity region 210. The extended part, not shown in FIG. 7D of the first plug 216 to the field insulating layer 202 is preferably for coupling to a bitline, which is perpendicular to the gate 206 over the field region.

A first insulating interlayer 219 can be formed by either depositing silicon oxide such as Undoped Silicate Glass (USG), Phosphor Silicate Glass (PSG), Borophospho Silicate Glass (BPSG), Tetra Ethyl Ortho Silicate CEOS) on the semiconductor substrate 200 or the like or coating the semiconductor substrate 200 with Spin On Glass (SOG). FIGS. 9A–9E are diagrams of cross-sectional views that show a second preferred embodiment of a method for fabricating a semiconductor device according to the present invention. The second preferred embodiment of a fabricating method preferably carries out a process in a cell region CA2 and a peripheral region PA2 simultaneously.

Figure 9A:
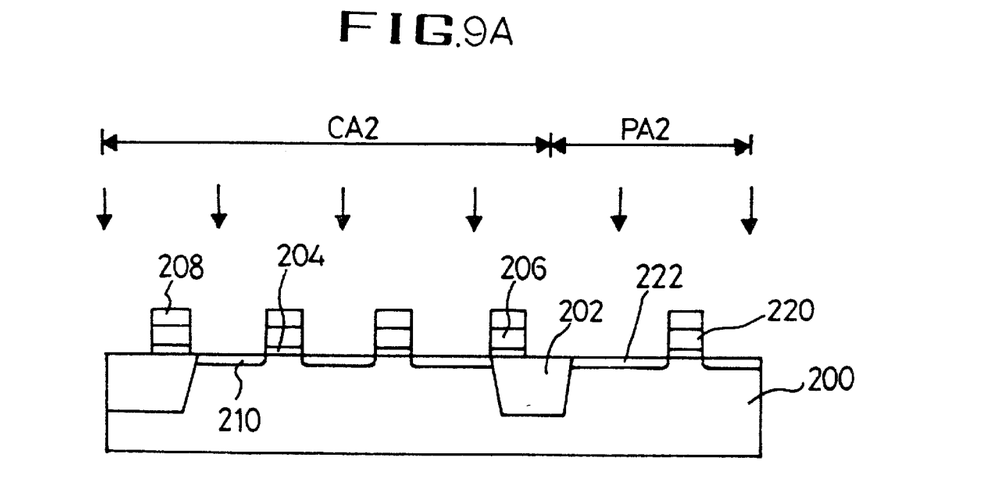
FIGS. 9A–9E are diagrams of cross-sectional views that show another preferred embodiment of a method of fabricating a semiconductor device in a cell region and a peripheral region according to the present invention.

Referring to FIG. 9A, an active area of a device is defined by forming a field insulating layer 202 with an STI method in a P-type semiconductor substrate 200 having a cell region CA2 and a peripheral region PA2. A gate oxide 204 is formed by thermally oxidizing an exposed portion, which is a surface of the active area of a device, of the semiconductor substrate 200. Polycrystalline silicon which is doped with impurities and an insulating substance such as silicon oxide and silicon nitride are respectively formed on the field insulating layer 202 and the gate oxide layer 204 by CVD.

The insulating substance and polycrystalline silicon are patterned along a direction perpendicular to the active area by photolithography. The remaining patterned polycrystalline silicon becomes gates 206, 220 and the silicon nitride on the gates 206, 220 becomes a first cap insulating layer 208. An impurity region 210 for a source/drain region of a memory cell and a lightly-doped impurity region 222 for an lightly doped drain (LDD) of a driving cell are formed in the cell region CA2 and the peripheral region PA2, respectively, by implanting N-typed impurities such as P, As or the like lightly in the exposed portions of the active area on the semiconductor substrate 200. The impurity region is preferably formed using the first cap insulating layer 208 as a mask.

Figure 9B:
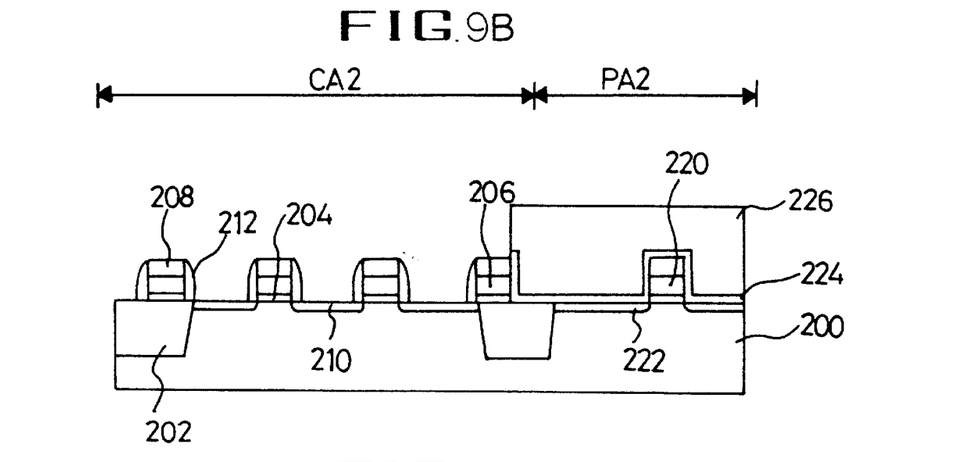

Referring to FIG. 9B, a sidewall spacer 212 is formed at the sides of the gate 206 and the first cap insulating layer 208, and an etch-stop layer 224 is formed on both of the semiconductor 200 and the gate 220 in the peripheral region PA2. The sidewall spacer 212 is preferably formed by depositing an insulating substance such as silicon nitride or silicon oxide on a whole surface of the cell region CA2 structure, forming a photoresist 226 on the insulating substance in the peripheral region PA2 and etching back an exposed or patterned part of the cell region CA2 with RME or the like to expose the impurity regions 210. The insulating substance remaining in the peripheral region PA2 preferably becomes the etch-stop layer 224 having an etch rate different than the semiconductor substrate 200 and the gate 220.

Figure 9C:
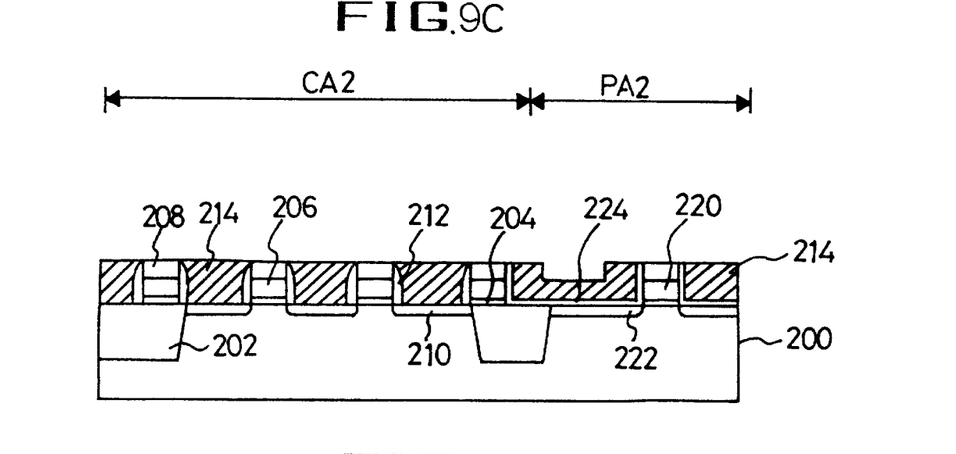

Referring to FIG. 9C, the photoresist 226 on the peripheral region PA2 is removed. An electrically-conductive layer 214 is preferably formed by depositing polycrystalline silicon doped with impurities on the semiconductor substrate 200 to cover the cell region CA2 and peripheral region PA2 structure by CVD. The electrically-conductive layer 214 is etched by CMP to remain only between the gates 206 and 220 and to expose the first cap insulating layer 208. The electrically-conductive layer 214 is on and contacts the impurity region 210 in the cell region CA2 and the etch-stop layer 224 in the peripheral region PA2.

Figure 9D:
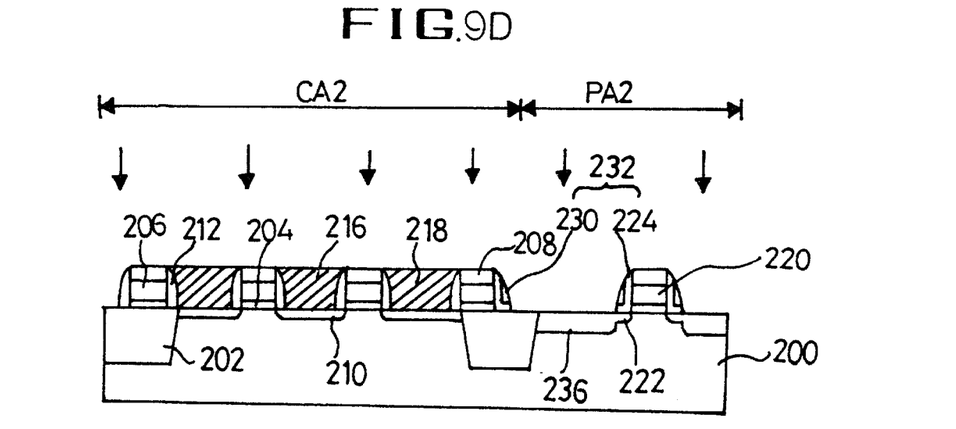

Referring to FIG. 9D, first plugs 216 and 218 are preferably formed by patterning the electrically-conductive layer 214 on the impurity region 210 in the cell region CA2 with photolithography using anisotropic etch including RIE, etc. The first plug 216 preferably extends to the field insulating layer 202 as well on the impurity region 210 while the other first plug 218 is on the impurity region 210 only.

The extended part (not shown) of the first plug 216 to the field insulating layer 202 preferably contacts a bitline perpendicular to the gate 206 over the field region. The impurity region 210 is free from a damage caused by etch since the first plugs 216 and 218 are patterned to remain on the impurity region 210. Moreover, both of the semiconductor substrate 200 and the gate 220 in the peripheral region PA2 are protected from etch by the etch-stop layer 224.

An insulator layer 230 is preferably formed by depositing silicon oxide or silicon nitride on the first plugs 216 and 218 and the etch-stop layer 224 with CVD or the like. Both of the insulator layer 230 and the etch-stop layer 224 in the peripheral region PA2 are preferably etched back by RIE, etc. to expose the impurity region 222. In this case, a double-layered sidewall spacer 232 including the etch-stop layer 224 and the insulator layer 230 is formed at the side of the gate 220.

A heavily-doped impurity region 236, which is preferably a source/drain region of a driving cell and overlapped with the lightly-doped impurity region 222, is formed by implanting N-typed impurities such as P, As, etc. heavily in exposed portions of the semiconductor substrate 200 in the peripheral region PA2 using the cap layer 208 and the double-layered sidewall spacer 232 as an etch mask. When the heavily-doped impurity region 236 is formed, the domain of the lightly-doped impurity region 222 is sufficiently secured by the double-layered sidewall spacer 232. Thus, in the second preferred embodiment of a fabrication process, generation of hot carriers by short channel effect are prevented in a driving cell of the peripheral region.

Figure 9E:
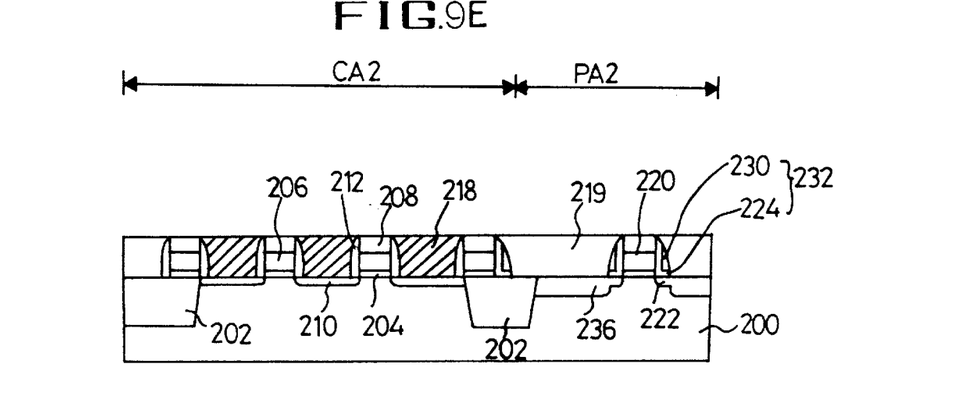

Referring to FIG. 9E, a first insulating interlayer 219 is preferably formed by either depositing silicon oxide such as Undoped Silicate Glass (USG), Phosphor Silicate Glass (PSG), Borophospho Silicate Glass (BPSG), Tetra Ethyl Ortho Silicate (TEOS) on the semiconductor substrate 200 or the like or coating the semiconductor substrate 200 with SOG. The first insulating layer 219 is preferably planarized by etch-back with CMP until reaching the first plugs 216 and 218.

FIGS. 10A–10D are diagrams of cross-sectional views that show a third preferred embodiment of a method for fabricating a semiconductor device. The third preferred embodiment of a method for fabricating a semiconductor device preferably forms second plugs on a structure such as the device shown in FIG. 7D according to the present invention. The cross-sectional views in FIGS. 10A–10D correspond to the cutting lines III—III and IV—IV in FIG. 6.

Figure 10A:
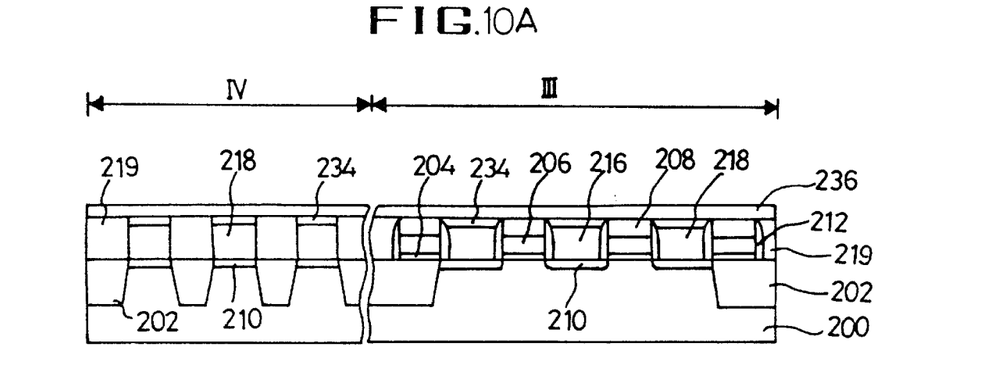
FIGS. 10A–10D are diagrams of cross-sectional views along cutting lines III—III and IV—IV in FIG. 6 that show another preferred embodiment of a method for fabricating a semiconductor device according to the present invention that forms a second plug.

Referring to FIG. 10A, preferably after the completion of the process shown in FIG. 7D, a low resistance layer 234 is preferably formed on the surfaces of the first plugs 216 and 218. The low resistance layer 234 is formed only on the first plugs 216 and 218 by carrying out a salicide process with metal of a high melting point such as W, Ti, Ta, Mo, Co or the like. A second insulating interlayer 236 is formed on the first insulating interlayer 219 and the first cap insulating layer 208 by depositing silicon oxide or silicon nitride to cover the low resistance layer 234. Then, an extended part of the low resistance layer 234 is preferably extended over the field insulating layer 202 and formed on the first plug 216 by patterning the second insulating layer 236 with photolithography.

Figure 10B:
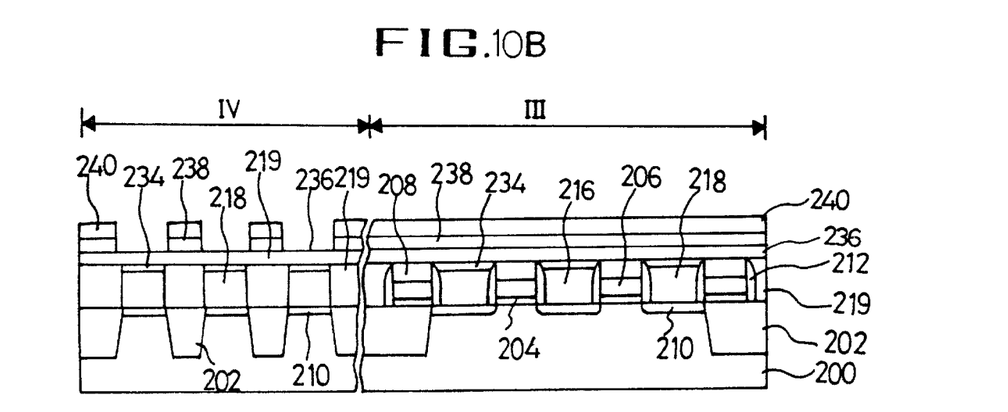

Referring to FIG. 10B, a metal such as tungsten (W), etc. is deposited on the second insulating interlayer 236, to be contacted with the exposed portion of the low resistance layer 234. Successively, an insulating substance such as silicon oxide, silicon nitride or the like is deposited on the metal. A bitline 238 and a second cap insulating layer 240 is preferably formed by patterning the insulating substance and the metal in turn. The bitline 238 and the second cap insulating layer 240 are preferably perpendicular to the gate 206 on a place corresponding to the field insulating layer 202.

Figure 10C:
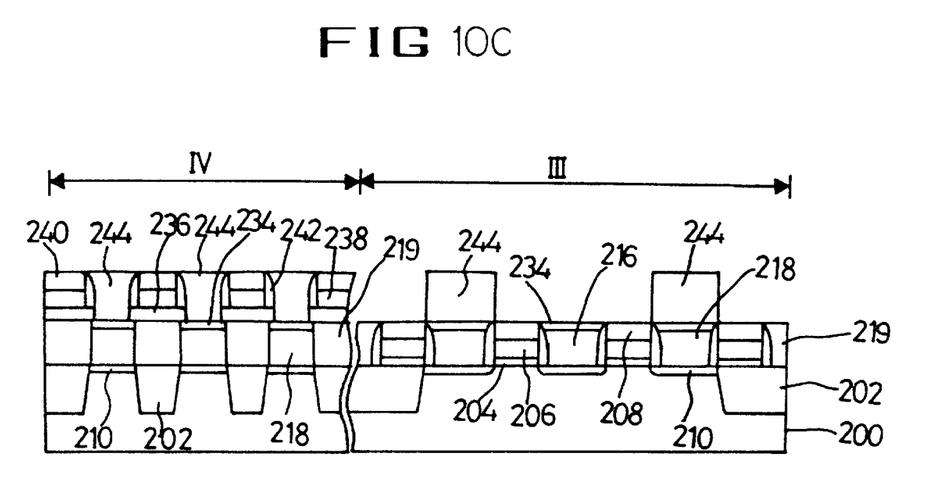

Referring to FIG. 10C, a sidewall spacer 242 is preferably formed at sides of the bitline 238 and the second cap insulating layer 240. The sidewall spacer 242 can be formed by depositing insulating substance such as silicon nitride etc. on the second insulating interlayer 236 to cover the second cap insulating layer 240 and etching back the insulating substance with RIE. When the sidewall spacer 242 is formed, the low resistance layer 234 on parts that are not overlapped with the bitline 238, the first plug 216 and the other first plug 218 are exposed by overetching the second insulating interlayer 236.

Polycrystalline silicon doped with impurities is preferably deposited on a whole surface of the above structure by CVD to contact the low resistance layer 234, and then, a conductive layer, which is not shown in the drawing, is formed by etching back the polycrystalline silicon. A second plug 244 is formed by patterning the conductive layer to remain just on a surface of the low resistance layer 234 on the other first plug 218. The second plug 244 is preferably used to connect the impurity region 210 electrically to a storage electrode (not shown in the drawing) of a capacitor through the other first plug 218. Thus, the second plug 244 should be avoided on a surface of the low resistance layer 234 on the first plug 216. The low resistance layer 234 reduces contact resistance between the first and second plugs 218 and 244.

Figure 10D:
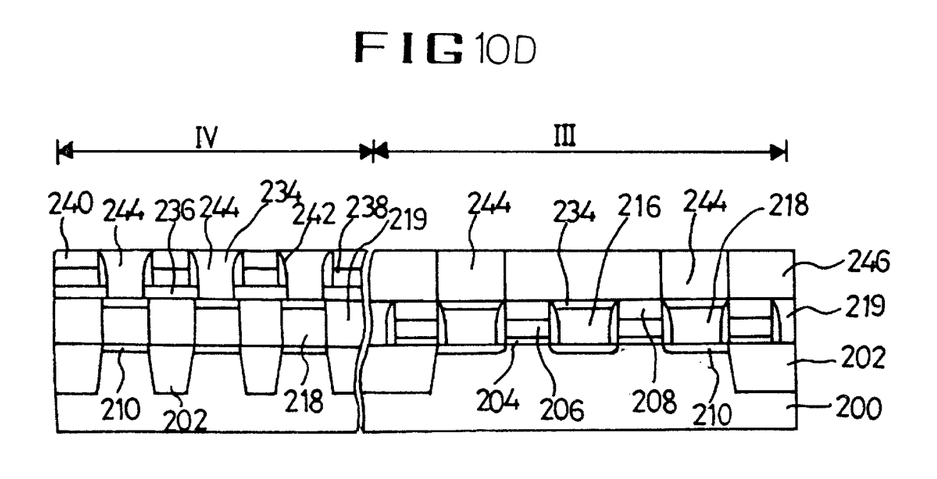

Referring to FIG. 10D, a third insulating interlayer 246 is preferably formed by either depositing silicon oxide such as Undoped Silicate Glass (USG), Phosphor Silicate Glass (PSG), Borophospho Silicate Glass (BPSG), Tetra Ethyl Ortho Silicate (TEOS) or the like on the semiconductor substrate 200 or coating the semiconductor substrate 200 with SOG to cover the second plug 244. Then, the third insulating interlayer 246 is preferably planarized by an etch-back of CMP until the second plug 244 is exposed.

As described above, the preferred embodiments according to the present invention have various advantages. A method of fabricating semiconductor devices according to preferred embodiments of the present invention can be carried out by depositing a conductive layer such as doped polycrystalline silicon on a substrate including an exposed impurity region for a source/drain and patterning the conductive layer selectively with photolithography using anisotropic etch or the like to form contact plugs. An insulating interlayer is then preferably formed on the semiconductor substrate to cover the plugs. The insulating interlayer can then be planarized by CMP or the like. The contact plugs can be formed contacting only the impurity region or formed to extend over a field insulating layer as well as contacting the impurity region. An exposure step according to the preferred embodiments of a method for manufacturing a contact or plug in a semiconductor device patterns a photoresist to remain on a cap insulating layer and a part of a conductive layer where plugs are to be formed. Thus, photolithography and the photoresist are used for forming plugs without contact holes. Accordingly, impurity region damage is prevented by patterning the plugs to remain on the impurity region. Moreover, generation of hot carriers are prevented by short channel effect of a driving cell because a source/drain is formed by a double-layered sidewall spacer in a peripheral region or the like.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method of fabricating a semiconductor device, comprising:

forming a semiconductor substrate of a first conductivity type;

forming a plurality of gates along a first direction on the semiconductor substrate;

forming impurity regions of a second conductive type in the substrate along sides of the gates;

forming a plurality of sidewall spacers at the sides of the gates;

forming a conductive layer that contacts the impurity regions adjacent the gates;

forming a plurality of plugs by patterning the conductive layer; and forming a first insulating layer where the plugs are not formed between the gates, wherein the forming a first insulating layer further comprises,
   depositing the first insulating layer, and
   planarizing the first insulating layer by etching back the first insulating layer with chemical mechanical polishing until the plugs are exposed.

2. The method of fabricating a semiconductor device according to claim 1, wherein each of the plugs contact a corresponding impurity region.

3. The method of fabricating a semiconductor device according to claim 2, wherein the first insulating layer is silicon oxide.

4. The method of fabricating a semiconductor device according to claim 1, wherein the forming a first insulating layer step immediately follows the forming a plurality of plugs step.

5. The method of fabricating a semiconductor device according to claim 1, wherein each of the gates comprise:
   a gate insulating layer;
   a gate electrode on the gate insulating layer; and
   a cap insulating layer on the gate electrode, wherein the cap insulating layer is at least one of silicon oxide and silicon nitride.

6. The method of fabricating a semiconductor device according to claim 1, wherein the sidewall spacers are at least one of silicon oxide and silicon nitride, and wherein the semiconductor device is a memory array with at least one peripheral circuit formed adjacent thereto.

7. The method of fabricating a semiconductor device according to claim 1, the step of forming the conductive layer comprises:
   forming polycrystalline silicon doped with impurities on the substrate, the impurity regions, the gates and the sidewall spacers; and
   etching back the polycrystalline silicon until the gates are exposed using chemical mechanical polishing.

8. The method of fabricating a semiconductor device according to claim 1, wherein the plugs are formed by patterning the conductive layer selectively with photolithography including anisotropic etch.

9. The method of fabricating a semiconductor device according to claim 1, further comprising forming a field insulating layer on the semiconductor substrate, wherein some of the plugs extend onto the field insulating layer, and wherein the remaining plugs are formed only on the impurity regions.

10. The method of fabricating a semiconductor device according to claim 9, wherein the plugs are formed by patterning the conductive layer until the field insulating layer is exposed.

11. A method of fabricating semiconductor devices, comprising:

forming a semiconductor substrate of a first conductivity type having an active area, wherein the semiconductor substrate includes a cell region and a peripheral region;

forming a plurality of gates along a first direction in the cell and peripheral regions;

forming a first impurity region along at least one gate in the cell region and a second impurity region along at least one gate in the peripheral region;

forming a first etch-stop layer covering both of the semiconductor substrate and the gates in the peripheral region;

forming a plurality of plugs in the cell region, wherein the forming a plurality of plugs consists of,
    forming first sidewall spacers at sides of the gates in the cell region,
    forming a first conductive layer between the gates to contact the first impurity region in the cell region and on the etch-stop layer in the peripheral region, and
    forming the plurality of plugs in the cell region by patterning the first conductive layer, wherein the plugs contact the first impurity region in the cell region;
forming a second sidewall spacers at the sides of the at least one gate to expose the second impurity region in the peripheral region, wherein the second sidewall spacers includes the etch-stop layer;
forming a heavily-doped impurity region in an exposed part of the second impurity region in the semiconductor substrate in the peripheral region; and
forming an insulating interlayer between the gates where the plugs are not formed.

12. A method of fabricating semiconductor devices, comprising:
    forming a semiconductor substrate of a first conductivity type having an active area, wherein the semiconductor substrate includes a cell region and a peripheral region;
    forming a plurality of gates along a first direction in the cell and peripheral regions;
    forming a first impurity region along at least one gate in the cell region and a second impurity region along at least one gate in the peripheral region;
    forming a first etch-stop layer covering both of the semiconductor substrate and the gates in the peripheral region and forming first sidewall spacers at sides of the gates in the cell region;
    forming a first conductive layer between the gates to contact the first impurity region in the cell region and on the etch-stop layer in the peripheral region;
    forming a plurality of plugs in the cell region by patterning the first conductive layer, wherein the plugs contact the first impurity region in the cell region;
    forming a second sidewall spacers at the sides of the at least one gate to expose the second impurity region in the peripheral region, wherein the second sidewall spacers includes the etch-stop layer;
    forming a heavily-doped impurity region in an exposed part of the second impurity region in the semiconductor substrate in the peripheral region; and
    forming an insulating interlayer between the gates where the plugs are not formed, wherein the forming the insulating interlayer comprises,
        depositing the insulating interlayer, and
        planarizing the insulating interlayer by etching back the insulating interlayer with chemical mechanical polishing to expose the plugs.

13. The method of fabricating semiconductor devices according to claim 12, the step of forming the first sidewall spacers and the etch-stop layer further comprises:
    forming an insulating substance layer on the semiconductor substrate to cover the gates;
    forming photoresist on the insulating substance layer, wherein the photoresist covers the peripheral region and exposes the cell region;
    forming the first sidewall spacers at the sides of the gates in the cell region by etching back the insulating substance layer using the photoresist as a mask, wherein the insulating substance layer is intact in the peripheral region to be the etch-stop layer; and
    removing the photoresist.

14. The method of fabricating semiconductor devices according to claim 13, wherein the insulating substance layer is at least one of silicon oxide and silicon nitride.

15. The method of fabricating semiconductor devices according to claim 12, wherein some of the plugs extend onto a field insulating layer that defines the active area from the first impurity region and the remaining plugs are only on the first impurity region.

16. The method of fabricating semiconductor devices according to claim 12, wherein the insulating interlayer is silicon oxide.

17. The method of fabricating semiconductor devices of claim 12 wherein the cell region is a memory array and the peripheral area is a peripheral circuit.

18. A method of fabricating a semiconductor device, comprising:
    forming a semiconductor substrate of a first conductivity type;
    defining an active area by forming a field insulating layer on the substrate;
    forming a plurality of gates along a first direction on the active area, each of the gates includes a gate oxide, a gate electrode on the gate oxide and a first cap insulating layer on the gate electrode;
    forming impurity regions of a second conductive type in an exposed area of the substrate in the active area along sides of the gates;
    forming a plurality of first sidewall spacers on the sides of the gates;
    forming a conductive layer to contact the impurity regions between the gates;
    forming a plurality of first plugs by patterning the conductive layer, wherein each of the first plugs contact a corresponding impurity region, wherein extended portions of some of the first plugs extend onto the field insulating layer;
    forming a first insulating interlayer where the first plugs are not formed between the gates;
    forming a second insulating interlayer on the first cap insulating layer to cover the first plugs and patterning the second insulating interlayer to expose at least one of the extended portions of the first plugs;
    forming a signal lines and a second cap insulating layer on the second insulating interlayer, wherein the signal lines contact the exposed portions of the first plugs;
    exposing the first plugs and forming second sidewalls at sides of the signal lines by etching the second insulating interlayer;
    forming second plugs that contact the exposed first plugs and forming a low resistance layer on the first plugs before the step of forming the second insulating interlayer.

19. The method of fabricating a semiconductor device according to claim 18, wherein the low resistance layer is formed by depositing metal such as W, Ti, Ta, Mo or Co and by forming salicide with the metal.

20. The method of fabricating a semiconductor device according to claim 18, wherein the step of forming the second plugs comprises:
    depositing doped polycrystalline silicon on the first and second cap insulating layers to contact the first plugs;

forming a second conductive layer by etching back the doped polycrystalline layer until the second cap insulating layer is exposed; and forming second plugs by patterning the second conductive layer to remain on the first plugs only.

21. A method of fabricating a semiconductor device, comprising:

forming a semiconductor substrate of a first conductivity type;

forming a plurality of gates along a first direction on the semiconductor substrate;

forming impurity regions of a second conductive type in the substrate along sides of the gates; and forming a plurality of plugs, wherein the forming a plurality of plugs consists of, forming a plurality of sidewall spacers at the sides of the gates, forming a conductive layer on the gates, the sidewall spacers and in contact with each of the impurity regions adjacent the gates, and forming the plurality of plugs by patterning the conductive layer.

22. The method of fabricating a semiconductor device according to claim 21, further comprising forming a first insulating layer where the plugs are not formed between the gates, wherein the forming the first insulating layer comprises:

depositing the first insulating layer; and etching the first insulating layer until the plugs are exposed, wherein the semiconductor device is a memory array, with at least one peripheral circuit formed adjacent thereto.

* * * * *